United States Patent
Boerstler et al.

(10) Patent No.: US 7,233,212 B2
(45) Date of Patent: Jun. 19, 2007

(54) OSCILLATOR ARRAY WITH ROW AND COLUMN CONTROL

(75) Inventors: David William Boerstler, Round Rock, TX (US); Eskinder Hailu, Austin, TX (US); Harm Peter Hofstee, Austin, TX (US); John Samuel Liberty, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/095,895

(22) Filed: Mar. 31, 2005

(65) Prior Publication Data
US 2006/0220753 A1    Oct. 5, 2006

(51) Int. Cl.
*H03B 29/00* (2006.01)
*H03K 3/03* (2006.01)

(52) U.S. Cl. ............... 331/78; 331/57; 708/251; 714/728

(58) Field of Classification Search ............ 331/57, 331/78; 708/251; 714/728
See application file for complete search history.

(56) References Cited

U.S. PATENT DOCUMENTS

| 4,799,259 | A | * | 1/1989 | Ogrodski | 380/46 |
| 4,905,176 | A | | 2/1990 | Schulz | 364/717 |
| 5,117,380 | A | | 5/1992 | Tanagawa | 364/717 |
| 5,633,609 | A | * | 5/1997 | Duncan | 327/292 |
| 5,706,218 | A | | 1/1998 | Hoffman | 364/717 |
| 5,963,104 | A | | 10/1999 | Buer | 331/78 |
| 6,480,072 | B1 | | 11/2002 | Walsh et al. | 331/78 |
| 6,480,870 | B1 | | 11/2002 | Park | 708/253 |
| 6,667,665 | B2 | | 12/2003 | Janssen | 331/78 |
| 6,891,442 | B2 | * | 5/2005 | Allen et al. | 331/57 |
| 7,058,674 | B2 | * | 6/2006 | Takagi | 708/251 |

\* cited by examiner

*Primary Examiner*—Robert Pascal
*Assistant Examiner*—James Goodley
(74) *Attorney, Agent, or Firm*—Stephen R. Tkacs; Stephen J. Walder, Jr.; Diana R. Gerhardt

(57) ABSTRACT

A circuit topology which can be used to create an array of individually tuned oscillators operating at different frequencies determined by common control inputs and an easily managed variation in design dimensions of several components is provided. An array of oscillators are provided arranged in columns and rows. Each oscillator in a column is unique from the other oscillators in the column based on number of stages in the oscillator and fanout so that each oscillator will operate at a unique frequency. Oscillators of different columns within the array may differ by a common setting of the selects to these oscillators and the physical ordering of the oscillators in the column to further reduce the possibility of injection locking. A base delay cell provides selects to each column of oscillators such that each column may be programmed to operate at a different frequency from its neighbors.

20 Claims, 6 Drawing Sheets

000 EVEN

OSCILLATOR ARRAY WITH ROW AND COLUMN CONTROL

BACKGROUND OF THE INVENTION

1. Technical Field

The present invention relates generally to an improved circuit topology for providing an array of individually tuned oscillators. More specifically, the present invention provides an oscillator array with row and column control that provides a plurality of individually tuned oscillators operating at different frequencies.

2. Description of Related Art

Random numbers are used in various encryption applications, which are particularly important in providing security for e-commerce applications as well as for a wide variety of other computer based or internet based communications and transactions. One approach to generating random numbers uses ring oscillators. In one approach using ring oscillators, a free running ring oscillator is used to clock a linear feedback shift register (LFSR). In another random number generator a single, slow voltage controller oscillator (VCO), which receives a noise input, samples the output of high speed ring oscillators.

One problem with some ring oscillator based random number generators, is that the sample frequency may be correlated to the ring oscillator frequency for a duration long enough to cause individual random number generator bits to be correlated and therefore, less random. It would be desirable to provide a random number generator that reduces or eliminates that correlation and produces random numbers that are more unpredictably random.

In U.S. Pat. No. 6,480,072 issued to Walsh et al. on Nov. 12, 2002, which is hereby incorporated by reference, this problem was addressed by utilizing an oscillator in an open loop configuration, such as a voltage controlled oscillator (VCO), whose output frequency is randomly controlled. The VCO output signal is sampled at a frequency much lower than, and asynchronous to, the frequency of the VCO output signal. The frequency of the VCO output signal is made to change significantly during each sample period. Due to the asynchronous relationship between the VCO output signal and the sample clock and the significant change in frequency during the sampling period, the exact number of VCO output periods, including any fractional parts, varies during each sample period. That variation is the basis for creating unpredictable randomness.

In U.S. Pat. No. 5,706,218 issued to Eric Hoffman on Jan. 6, 1998, which is hereby incorporated by reference, a random number generator is disclosed that uses a plurality of high frequency ring oscillators and a single, slow, voltage controlled oscillator which receives a noise input. The ring oscillators are sampled under control of the slow oscillator. A circuit is used between the output of each of the ring oscillators and its respective D-type latch to assure that the sampling is unbiased, that is, that there will be near even distribution of 1s and 0s in the random numbers.

Other random number generator mechanisms are described in, for example, U.S. Pat. Nos. 6,667,665; 4,905,176; 5,117,380; 5,963,104; and 6,480,870. In some of these random number generator mechanisms, the random number generator is not a true random number generator but rather a pseudo-random number generator. In many of these random number generators, negative affects of injection locking, large chip area requirements, and large amounts of design and layout time are experienced. It would be beneficial to have an improved mechanism for generating truly random numbers, as opposed to pseudo-random numbers, that results in minimal injection locking, minimal chip area requirements, and minimal amounts of design and layout time.

SUMMARY OF THE INVENTION

The present invention provides a circuit topology which can be used to create an array of individually tuned oscillators operating at different frequencies determined by common control inputs and an easily managed variation in design dimensions of several components. The result is an array of oscillators with minimal injection locking and coupling potential, minimal area, and greatly reduced design and layout time compared to prior art or conventional means.

With the circuit topology of the present invention, an array of oscillators is provided arranged in columns and rows. Each oscillator in a column is unique from the other oscillators in the column based on the number of stages in the oscillator and fanout so that each oscillator will operate at a unique frequency. For example, in an 8×8 array of oscillators, oscillators 1–3 in a column of the array may have 5 stages with fanouts of 3, 4 and 5 respectively. Oscillators 4–6 in the column of the array may have 7 stages with fanouts of 3, 4 and 5 respectively, etc.

Oscillators of different columns within the array may differ by a common setting of the selects to these oscillators and the physical ordering of the oscillators in the column to further reduce the possibility of injection locking. A base delay cell is provided with programmable strength which can be configured at a higher level in the physical hierarchy. This base delay element may be used with the oscillators of the array to provide selects to each column of oscillators such that each column may be programmed to operate at a different frequency from its neighbors.

In one exemplary embodiment, each column of oscillators is inverted in order from that of its neighboring columns. Thus, if a first column has oscillators that have 5 stages/3 fanout, 5 stages/4 fanout, 7 stages/5 fanout, and 7 stages/7 fanout, in that order, any neighboring column would have oscillators in the following order: 7 stages/7 fanout, 7 stages/5 fanout, 5 stages/4 fanout, and 5 stages/3 fanout. This arrangement of columns, as well as the differing selects input to each column of oscillators helps to assure that neighboring oscillators do not operate at frequencies that are similar to each other.

As a result, injection locking and coupling potential is minimized by this arrangement of oscillators. In addition, because each oscillator in the array of oscillators is identical in construction, the design and layout is simplified. Thus, design and layout time is minimized. The result of the circuit topology of the present invention is that each oscillator in the array of oscillators operates at a unique frequency that is not harmonically related to any other frequency of any other oscillator in the array. Since the ring oscillators truly operate independent of the other oscillators in the array, the array of ring oscillators according to the present invention provides a basis for obtaining a truly random number by sampling the frequency outputs of the array.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present invention provides an array of independently operating free running ring oscillators that each generate a unique frequency output from those of the other oscillators in the array. Each oscillator is subject to substantial jitter. As a result, the oscillators in the array may provide a truly randomized source for generating random numbers. Other similar cryptographic applications or applications in which randomness is an important aspect of the application, may make use of the array of ring oscillators according to the present invention. For purposes of the present description, it will be assumed that the ring oscillators of the present invention are used to provide a source for generating random numbers in a random number generator.

It should be appreciated that while the following description provides exemplary embodiments that are directed to a ring oscillator array, the present invention is not limited to such. To the contrary, the oscillator array of the present invention may make use of other types of oscillators with tunable elements. For example, rather than ring oscillators with adjustable numbers of stages as described hereafter, the present invention may make use of LC oscillators with varactor tuning, with fanout being a second tunable element. For purposes of the present description, however, the exemplary embodiments are described in terms of ring oscillators and a ring oscillator array.

Figure 1:
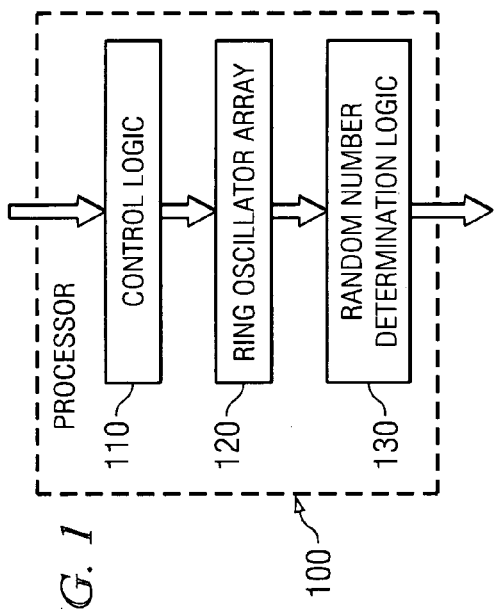
FIG. 1 is an exemplary block diagram of a random number generator according to one exemplary embodiment of the present invention.

FIG. 1 is an exemplary block diagram of a random number generator according to one exemplary embodiment of the present invention. As shown in FIG. 1, control logic 110 is coupled to ring oscillator array 120, which in turn is coupled to random number determination logic 130. These elements 110–130 may be part of a processor 100, for example. Alternatively, different combinations of elements 110–130 may be part of a processor 100 with other elements 110–130 being provided in a separate unit coupled to the processor 100.

The control logic 110 provides input signals to the input ports of the ring oscillator array 120. Each ring oscillator in the ring oscillator array 120 generates an output. These outputs are combined into a multiple bit value output of the ring oscillator array 120. The output value from the ring oscillator array 120 is provided to random number determination logic 130, which generates a random number from the output value.

The present invention is directed to an improved arrangement of the ring oscillator array 120. The present invention provides a circuit topology which can be used to create an array of individually tuned ring oscillators operating at different frequencies determined by common control inputs and an easily managed variation in design dimensions of several components. The result is an array of ring oscillators with minimal injection locking and coupling potential, minimal area, and greatly reduced design and layout time compared to prior art or conventional means.

With the circuit topology of the present invention, an array of ring oscillators is arranged in columns and rows. Each ring oscillator in a column is unique from the other ring oscillators in the column based on the number of stages in the ring oscillator and fanout so that each ring oscillator will operate at a unique frequency. Ring oscillators of different columns within the array may differ by a common setting of the selects to these ring oscillators and the physical ordering of the ring oscillators in the column to further reduce the possibility of injection locking. A base delay cell is provided with programmable strength that can be configured at a higher level in the physical hierarchy. This base delay element may be used with the ring oscillators of the array to provide selects to each column of ring oscillators such that each column may be programmed to operate at a different frequency from its neighbors.

As a result, injection locking and coupling potential is minimized by this arrangement of ring oscillators. In addition, because each ring oscillator in the array of ring oscillators is identical in construction, the design and layout is simplified. Thus, design and layout time is minimized. The result of the circuit topology of the present invention is that each ring oscillator in the array of ring oscillators operates at a unique frequency that is not harmonically related to any other frequency of any other ring oscillator in the array. Since the ring oscillators truly operate independent of the other ring oscillators in the array, the array of ring oscillators according to the present invention provides a basis for obtaining a truly random number by sampling the frequency outputs of the array.

Figure 2:
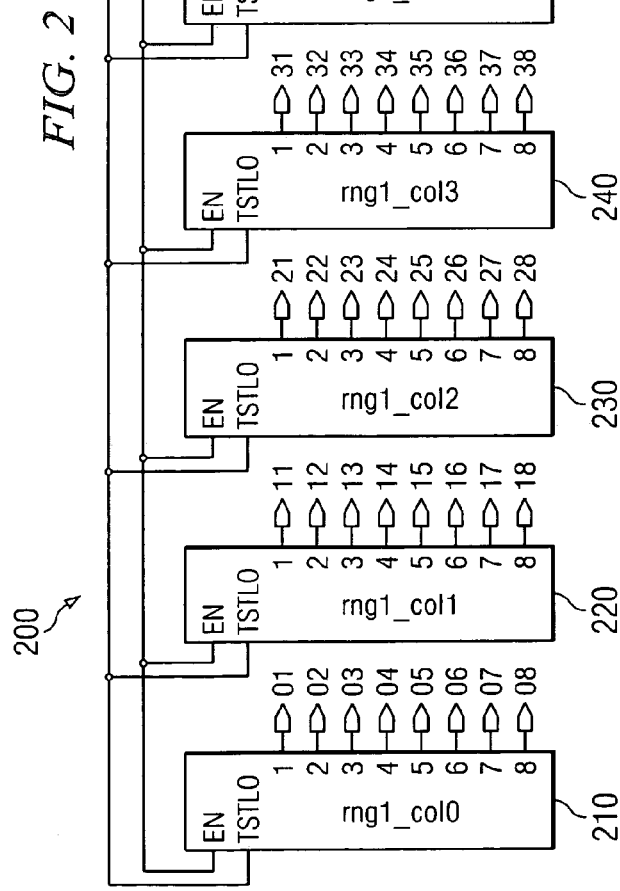
FIG. 2 is an exemplary diagram illustrating an array of 8 oscillator columns with shared inputs in accordance with one exemplary embodiment of the present invention.

FIG. 2 is an exemplary diagram illustrating an array of 8 ring oscillator columns with shared inputs in accordance with one exemplary embodiment of the present invention. In the exemplary embodiment illustrated in FIG. 2 and the following figures, an 8×8 array of ring oscillators is depicted for reasons of explanation of the present invention. Such an array provides a 64 bit value output from the array of ring oscillators. While an 8×8 array is illustrated in the figures, it should be appreciated that the present invention is not limited to such an arrangement and any size array of ring oscillators may be used without departing from the spirit and scope of the present invention.

As shown in FIG. 2, the array of ring oscillators 200 is comprised of ring oscillator columns 0–7, denoted rng1_col0 to rng1_col7 and enumerated 210–280. In one exemplary embodiment, each column of ring oscillators 210–280, or ring oscillator column, is comprised of 8 individual ring oscillators each operating at a unique frequency as controlled by the present invention.

Each ring oscillator column 210–280 of the array 200 is coupled to common inputs "en" and "tstlo." Input "en" is an enable input, from control logic 110, for example, that enables operation of the ring oscillators in the ring oscillator columns 210–280 of the array 200 in the manner described hereafter. The "tstlo" input is an input, from control logic 110, for example, for placing the array in a test mode forcing a low condition to be sensed by the random number determination logic, e.g., random number determination logic 130. De-asserting the "en" enable input opens the ring oscillator loop and sets the input to the random number determination logic 130 to a level determined by the state of "tstlo," allowing deterministic DC testing via sampling. That is, by setting the input to the random number determination logic 130 to a known level, the functioning of the random number determination logic 130 may be verified.

Each ring oscillator column 210–280 is comprised of one or more similarly structured ring oscillators, as described hereafter. While each ring oscillator in a ring oscillator column 210–280 is structured similarly to other ring oscillators in the same or other ring oscillator columns 210–280, each ring oscillator differs from all other ring oscillators in the array 200 with regard to the combination of stages of the ring oscillator, fanout, and inputs s0, s1 and s2 (see FIGS. 3 and 4 hereafter) from control logic, such as control logic 110.

Control logic 110 provides input signal values s0, s1 and s2, and their complements to each ring oscillator column 210–280. These inputs s0, s1 and s2 modify the operation of a delay element associated with each ring oscillator in the ring oscillator array 200. By providing a different combination of inputs s0, s1 and s2 to each ring oscillator column 210–280, each ring oscillator column 210–280 is configured to operate at a different frequency from its neighboring column.

The difference in the combination of stages and fanout of each ring oscillator in a ring oscillator column 210–280 makes each ring oscillator in a ring oscillator column 210–280 operate at a different frequency than the other ring oscillators in the ring oscillator column 210–280. The difference in placement order of the ring oscillators in a ring oscillator column 210–280 from similarly structured ring oscillators in other columns 210–280, with regard to number of stages and fanout, ensures minimal injection locking and coupling potential between neighboring ring oscillators. In addition, the inherent jitter in the ring oscillators provides a measure of randomness to the frequency and phase of the ring oscillators. As a result, each ring oscillator in the array 200 operates at a different frequency from every other ring oscillator in the array 200.

Figure 3:
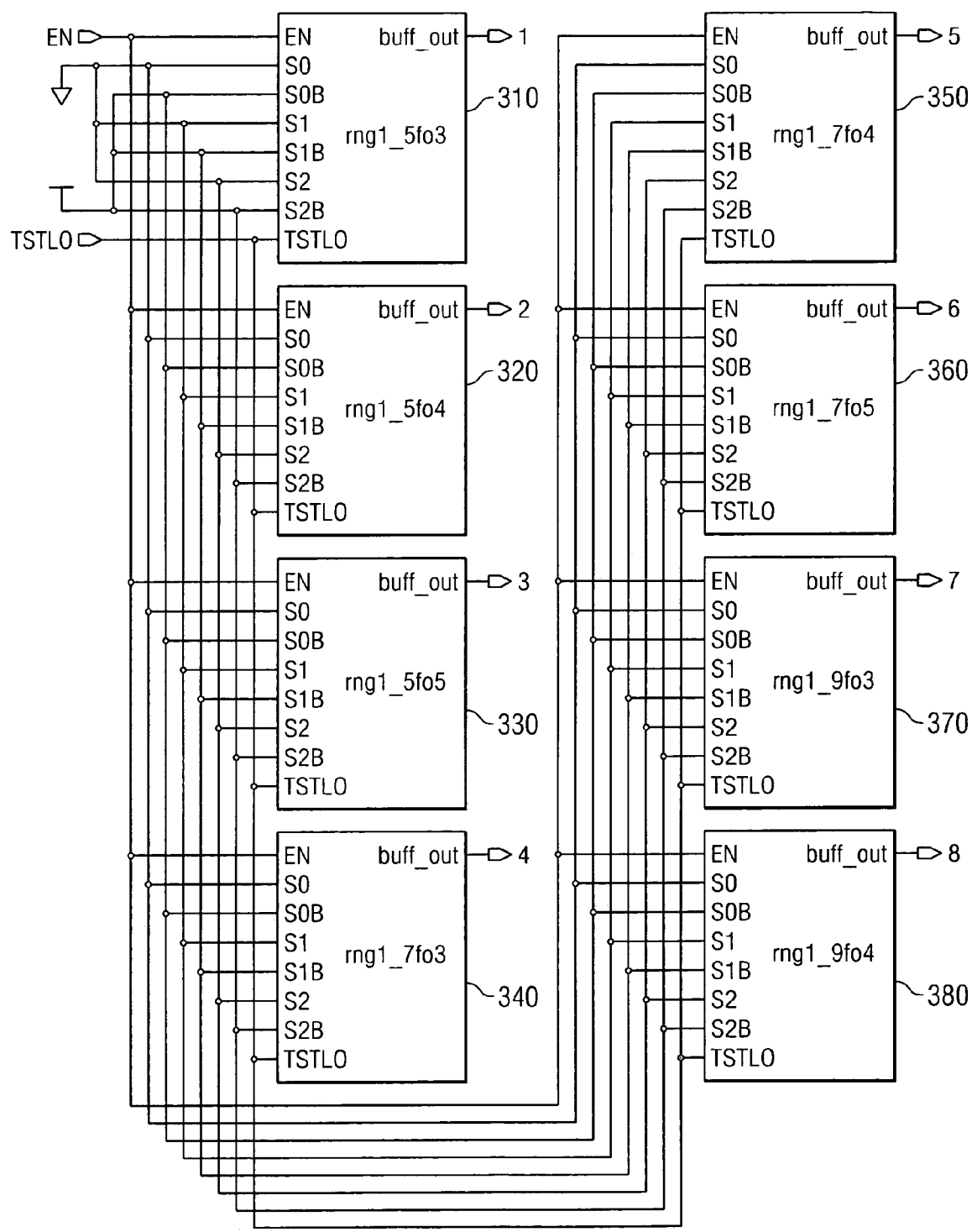
FIG. 3 is an exemplary diagram illustrating a first column of an oscillator array with all of their select inputs and their complements common for the column in accordance with on exemplary embodiment of the present invention.

FIG. 3 is an exemplary diagram illustrating a first column of a ring oscillator array with all of their select inputs and their complements common for the column in accordance with on exemplary embodiment of the present invention. The ring oscillator column 300, shown in FIG. 3, may be an example of the ring oscillator 210 in FIG. 2, for example. The ring oscillator column 300 shown in FIG. 3 is referred to as an "even" column in order to differentiate it from its neighboring "odd" ring oscillator column or columns, which will be described hereafter. In the particular ring oscillator column 300 depicted, the inputs s0, s1 and s2 are set to 0,0,0. The implications of this setting of the inputs will be described hereafter with regard to the delay element of FIG. 6, which is integrated into each ring oscillator.

As shown in FIG. 3, the ring oscillator column 300 is comprised of a plurality of individual ring oscillators 310–380. These ring oscillators have labels such as "rng1_7fo3," meaning that it is a ring oscillator having 7 stages and a fanout out ("fo") of 3. It is clear that, in this exemplary embodiment, the ring oscillator 310 has 5 stages and a fanout of 3, ring oscillator 320 has 5 stages and a fanout of 4, ring oscillator 330 has 5 stages and a fanout of 5, ring oscillator 340 has 7 stages and a fanout of 3, ring oscillator 350 has 7 stages and a fanout of 4, ring oscillator 360 has 7 stages and a fanout of 5, ring oscillator 370 has 9 stages and a fanout of 3, and ring oscillator 380 has 9 stages and a fanout of 4. Thus, each ring oscillator 310–380 is unique in the ring oscillator column 300 by number of stages and fanout. As is well known to those of ordinary skill in the art, the frequency of a ring oscillator may be determined by the number of stages of the ring oscillator, the delay of each stage, and the fanout of the ring oscillator. Thus, since each ring oscillator 310–380 in the ring oscillator column 300 is unique with regard to stages and fanout, each ring oscillator in the ring oscillator column 300 operates at a unique frequency relative to other ring oscillators in the column 300.

Because each ring oscillator is subject to a substantial amount of random jitter, the actual frequency output of the ring oscillators 310–380 is randomized. Each output 1–8 of the ring oscillators 310–380 provides an output value that, combined with the outputs of the other ring oscillators, in ring oscillator column 300 and other columns in the ring oscillator array, are used to generate a random output value of the ring oscillator array. For example, in an 8×8 array of ring oscillators, 64 outputs are generated by the ring oscillators thereby generating a 64 bit value that may be used as a basis for generating a random number output.

As described hereafter, the setting of the input values s0–s3 also influences the frequency output of the ring oscillators. These inputs, which are common to each ring oscillator 310–380 in the ring oscillator column 300, are used to control a delay element in each ring oscillator 310–380 so as to provide a different amount of delay to ring oscillators 310–380 in ring oscillator column 300 as opposed to ring oscillators in other ring oscillator columns of the ring oscillator array.

Figure 4:
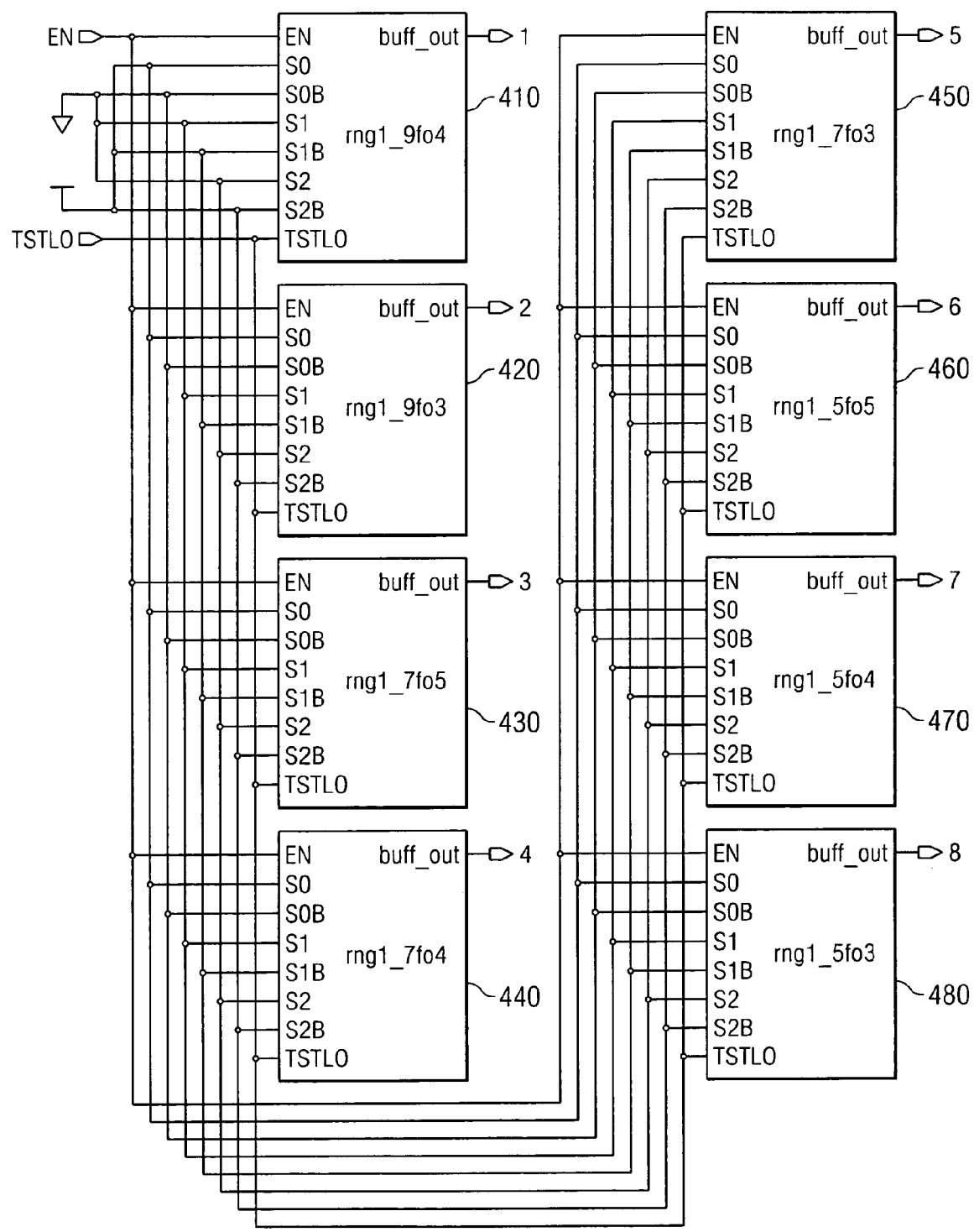
FIG. 4 is an exemplary diagram illustrating a second column of an oscillator array with all of their select inputs and their complements common for the column but different from the selects of the first column shown in FIG. 3, in accordance with one exemplary embodiment of the present invention.

FIG. 4 is an exemplary diagram illustrating a second column of a ring oscillator array with all of their select inputs and their complements common for the column but different from the selects of the first column shown in FIG. 3, in accordance with one exemplary embodiment of the present invention. The ring oscillator column 400 in FIG. 4 is referred to as an "odd" ring oscillator column in order to differentiate it from the "even" ring oscillator columns of the ring oscillator array, such as the "even" ring oscillator column shown in FIG. 3. Any neighboring ring oscillator columns of the "odd" ring oscillator column will be an "even" ring oscillator column having an opposite physical arrangement of ring oscillators, as described hereafter.

As shown in the exemplary embodiment of FIG. 4, a first ring oscillator 410 of the ring oscillator column 400 is a 9 stage ring oscillator with a fanout of 4. Thus, ring oscillator 410 has a similar configuration as ring oscillator 380 in FIG. 3. In a similar manner, ring oscillator 420 is a 9 stage ring oscillator with a fanout of 3, which corresponds to ring oscillator 370 of FIG. 3. Thus, in one exemplary embodiment of the present invention, each ring oscillator column in the ring oscillator array has an opposite or inverted arrangement of ring oscillators when compared to its neighboring ring oscillator column(s). With such an arrangement, it is ensured that each ring oscillator operates at a different frequency than its neighboring ring oscillators in the same or a different ring oscillator column. As a result, the possibility of injection locking is minimized.

While in the depicted exemplary embodiment, each column has an opposite or inverted arrangement of ring oscillators from that of its neighbors, such a configuration of the ring oscillator array is not required by the present invention. Other configurations of the ring oscillator columns in the ring oscillator array may be utilized by the present invention so long as these configurations ensure that neighboring ring oscillators do not operate at the same frequency. For example, each ring oscillator in the ring oscillator array may have a different combination of number of stages and fanout from every other ring oscillator in the ring oscillator array. Moreover, more than two different arrangements of ring oscillators in a ring oscillator column, i.e. "even" and "odd" ring oscillator columns, may be used so that some ring oscillator columns are not opposite or inverted to some of their neighbors but injection coupling is still minimized.

The inputs s0–s2 of the ring oscillator column 400 have values 0, 0, 1. As with the ring oscillator column 300 in FIG. 3, the setting of these inputs s0–s2 modifies the operation of the ring oscillators 410–480 due to a delay element incorporated into each of the ring oscillators 410–480. The setting of these inputs s0–s2 helps to ensure that the ring oscillators 410–480 generate a different frequency output than other "odd" columns that may be present in the ring oscillator array. Each ring oscillator column in the ring oscillator array may be provided with a different set of input values for s0–s3. Thus, the combination of the inputs s0–s2, the number of stages, the fanout, and the arrangement of the ring oscillators in the ring oscillator columns of the ring oscillator array, ensures that each ring oscillator generates an independent and unique frequency output from all other ring oscillators in the ring oscillator array.

It should be noted that, in the depicted embodiment, the number of inputs s0–s2 is three in order to ensure a different set of input values for s0–s2 may be input to each ring oscillator column of the 8×8 ring oscillator array. However, in other embodiments in which a greater or lesser number of ring oscillator columns is utilized, the number of inputs may be different from that depicted. Thus, for example, if a larger number of ring oscillator columns is utilized in the ring oscillator array, additional inputs may be required in order to ensure that each ring oscillator column is provided with a unique set of inputs from all other ring oscillator columns in the ring oscillator array.

Figure 5:
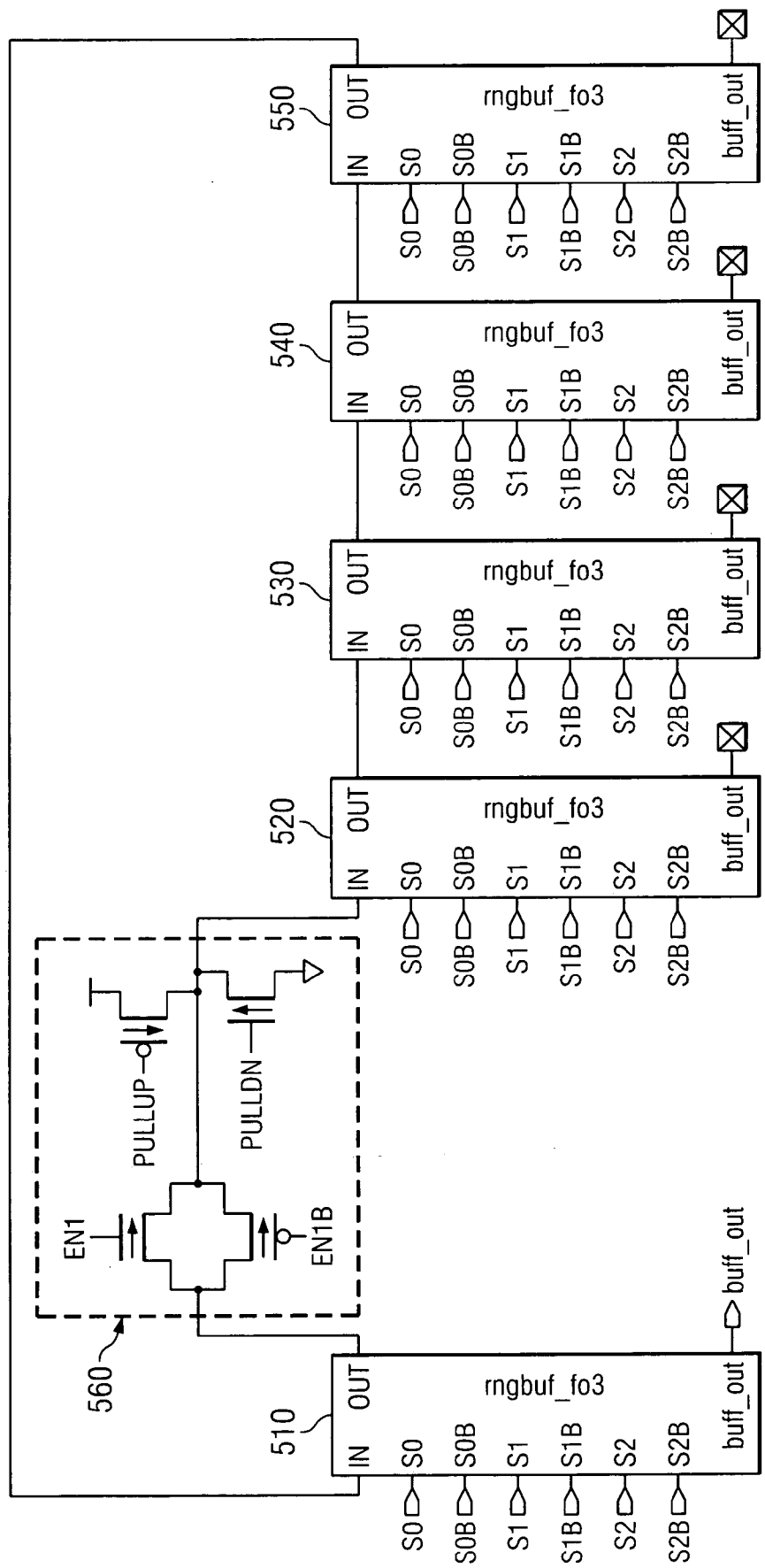
FIG. 5 is an exemplary diagram illustrating a structure of a five stage oscillator in accordance with one exemplary embodiment of the present invention.

FIG. 5 is an exemplary diagram illustrating a structure of a five stage ring oscillator in accordance with one exemplary embodiment of the present invention. The five stage ring oscillator 500 shown in FIG. 5 has 5 ring buffers 510–550 one for each stage of the ring oscillator 500. The ring buffers 510–550 in FIG. 5 are labeled rngbuf_fo3 meaning that each ring buffer has a fanout of 3 and thus, the ring oscillator is a five stage ring oscillator with a fanout of 3.

The ring oscillator 500 also includes a stop circuit 560 which permits operation of the ring oscillator 500 to be interrupted. The purpose and operation of this stop circuit is not integral to the main focus of the present invention and thus, a detailed explanation of the use of this stop circuit 560 is not provided herein. With regard to the present invention, the ring oscillator 500 would operate appropriately without the presence of the stop circuit 560.

It should be appreciated that the ring oscillator 500 shown in FIG. 5 is only exemplary of ring oscillators that may be utilized in the ring oscillator array of the present invention. Other ring oscillators having different numbers of stages, different numbers of fanout, and the like, would include additional ring buffers having different fanouts, and the like.

Figure 6:
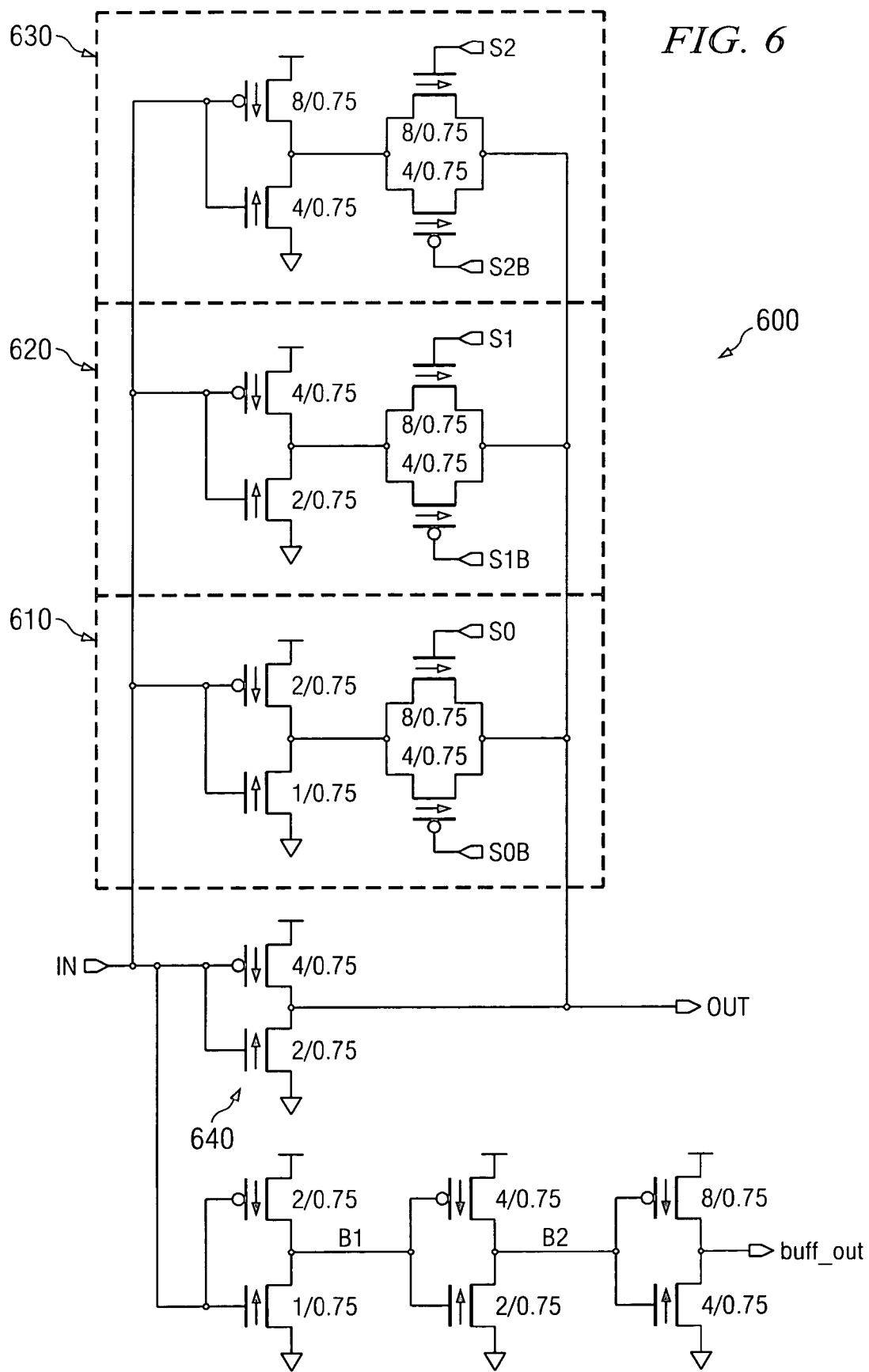
FIG. 6 is an exemplary diagram illustrating a delay element in accordance with one exemplary embodiment of the present invention.

FIG. 6 is an exemplary diagram illustrating a delay element in accordance with one exemplary embodiment of the present invention. The delay element 600 shown in FIG. 6, in an exemplary embodiment, is part of a ring buffer in a ring oscillator, such as ring buffers 510–550 in FIG. 5. As shown in FIG. 6, inputs s0–s2, and their complements s0b–s2b are used to enable or disable elements 610–630. Elements 610–630 are comprised of an inverter and a pass gate. If the value of an input, e.g., s0, is 0, the signal output of the inverter in the corresponding element is not permitted to pass through the corresponding pass gate of the element. If the value of the input is 1, the signal from the inverter is permitted to pass through the corresponding pass gate and, as a result, is added to the output signal of the inverter 640. This addition causes the output of the delay element 600 to be performed faster, or at an increased frequency.

For example, if all of the inputs s0–s2 are set to 0, the output generated by the delay element 600 has an effective field effect transistor (FET) channel width of 6 (i.e. 4 plus 2 from inverter 640). If s0 is set to 1 and s1–s2 are kept at 0, the effective device widths has a value of 6 (PFET) and 3 (nFET), i.e. 4 plus 2 from inverter 640 and 2 plus 1 from the inverter of element 610, which results in the output signal being generated with shorter delay. The strength, which is proportional to the width/length values, is increased by 50%. It can be seen that in the depicted embodiment, the inverter of element 610 has effective device width values that are half that of inverter 640. The inverter of element 620 has effective device width values that are twice as large as the inverter of element 610. The inverter of element 630 has effective device width values that are twice as large as the inverter of element 630. Thus, by selectively providing different combinations of input values s0–s2, different frequency outputs are generated by each of the ring buffers of the ring oscillator.

Thus, the delay element of FIG. 6 is provided with programmable strength which can be configured at a higher level in the physical hierarchy. If elements 610, 620 and 630 are not asserted (s0=s1=s2=0, s0b=s1b=s2b=1), then the strength of the path is determined by devices N2 and P2. If, for example, 610 is asserted (s0=1, s0b=0), then the path strength is boosted due to N3, P3 added to N2, P2.

Using the delay element shown in FIG. 6 in ring oscillators having different numbers of stages and different fanouts provides a mechanism for ensuring that each ring oscillator in a ring oscillator array generates a different frequency output. In an 8×8 ring oscillator array, this results in 64 independently operated ring oscillators generating a truly randomized 64 bit output. This 64 bit output may then be used to generate a random number output which can be used for a plurality of different purposes including cryptographic applications.

Figure 7:
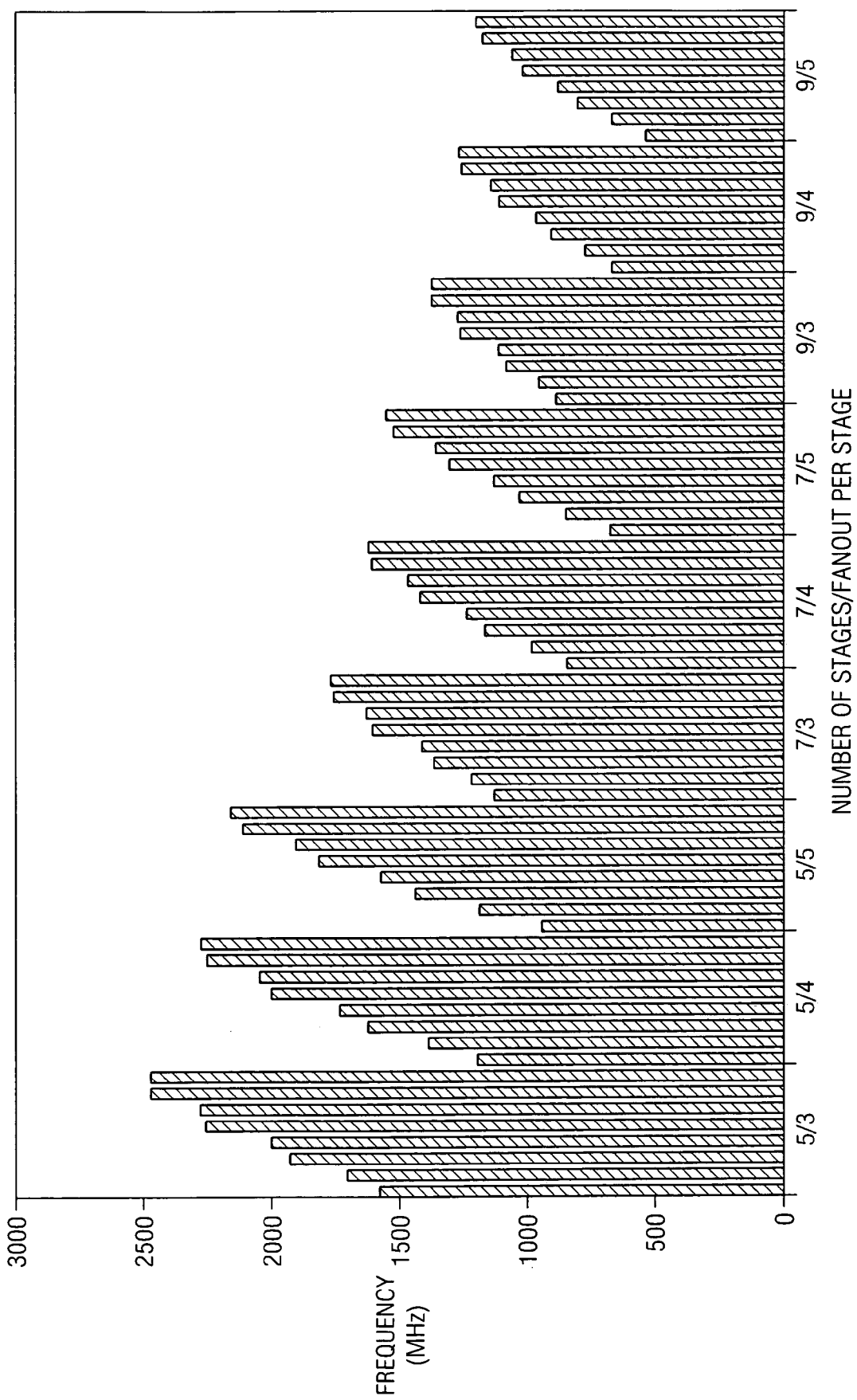
FIG. 7 is an exemplary diagram illustrating the uniqueness of frequencies of the various oscillators in an array of oscillators in accordance with exemplary embodiments of the present invention.

FIG. 7 is an exemplary diagram illustrating the uniqueness of frequencies of the various ring oscillators in an array of ring oscillators in accordance with exemplary embodiments of the present invention. The plot shown in FIG. 7 illustrates the free-running frequency outputs of ring oscillators in an 8×8 ring oscillator array according to the present invention. The ring oscillators used to generate the plot included ring oscillators having 5, 7 and 9 stages with fanouts of 3, 4 and 5. As shown in FIG. 7, each frequency is unique and is not harmonically related to any other frequency, i.e. no integer multiple exists between the frequencies of any two ring oscillators.

Thus, the ring oscillator array according to the present invention provides a basis for generating a truly random number with minimal injection locking. Furthermore, the topology of the circuitry to generate the ring oscillator array of the present invention is relatively simple to design and layout and takes up minimal area on chip. Thus, the present invention achieves minimal injection locking, minimal design and layout time, and minimal chip area.

While the above description has been provided in terms of the ring oscillator array structure of the present invention, it should be appreciated that the present invention further includes a method of making such a ring oscillator array. The particular techniques for generating a ring oscillator array used by the present invention are generally known in the art but have not been applied to making the particular structures described above. Therefore, the present invention further includes the use of such known techniques an applying them to making the particular ring oscillator array structure described above. The particular manner for adapting these known techniques to making the ring oscillator array structure of the present invention will be readily apparent to those of ordinary skill in the art based on the above description of the ring oscillator array structure.

Furthermore, as mentioned previously, it should be appreciated that while the following description provides exemplary embodiments that are directed to a ring oscillator array, the present invention is not limited to such. To the contrary, the oscillator array of the present invention may make use of other types of oscillators with tunable elements. For example, rather than ring oscillators with adjustable numbers of stages as described hereafter, the present invention may make use of LC oscillators with varactor tuning, with fanout being a second tunable element. Other types of tunable oscillators may also be used so long as the result is an oscillator array in which each oscillator in the array has a unique frequency from every other oscillator in the oscillator array.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An oscillator array, comprising:
a plurality of oscillator columns, wherein each oscillator column has a plurality of oscillators; and
a plurality of input lines coupled to the plurality of oscillators in the plurality of oscillator columns, wherein each oscillator in the oscillator array generates a frequency output, based on input signals provided via the plurality of input lines, that is unique from every other oscillator in the oscillator array, and wherein the frequency output is not harmonically related to any other frequency output of any other oscillator in the oscillator array.

2. The oscillator array of claim 1, wherein the frequency output that is generated by each oscillator is based on a number of stages of the oscillator, a delay associated with each stage of the oscillator, a fanout of the oscillator, and a setting of input signals input to the oscillator.

3. The oscillator array of claim 1, wherein each oscillator in the oscillator array includes one or more delay elements, and wherein the one or more delay elements cause the oscillator to generate a different frequency output based on a setting of input signals input to the one or more delay elements.

4. The oscillator array of claim 1, wherein one or more outputs of the oscillator array are coupled to a cryptographic element which uses the one or more outputs of the oscillator array to perform cryptographic operations.

5. The oscillator array of claim 4, wherein the cryptographic element is a random number generator element.

6. The oscillator array of claim 1, wherein each oscillator in a same oscillator column is unique from the other oscillators in the same oscillator column based on a combination of a number of stages in the oscillator and a fanout of the oscillator.

7. The oscillator array of claim 1, wherein oscillators of different columns within the oscillator array differ from one another at least by a setting of the input signals to these oscillators and a physical ordering of the oscillators in their respective oscillator columns.

8. The oscillator array of claim 1, wherein the oscillator array includes 8 oscillator columns and each oscillator column includes 8 oscillators, and wherein an output of the oscillator array is a 64 bit value.

9. The oscillator array of claim 1, wherein every oscillator column in the oscillator array has an opposite arrangement of oscillators from its neighboring oscillator column or columns.

10. The oscillator array of claim 3, wherein each of the delay elements includes a plurality of stages, and wherein each stage includes an inverter and a pass gate, and wherein the inverters of each stage have a different strength than inverters of other stages in the delay element.

11. A method of making an oscillator array, comprising:
providing a plurality of oscillator columns, wherein each oscillator column has a plurality of oscillators; and
providing a plurality of input lines coupled to the plurality of oscillators in the plurality of oscillator columns, wherein each oscillator in the oscillator array generates a frequency output, based on input signals provided via the plurality of input lines, that is unique from every other oscillator in the oscillator array, and wherein the frequency output is not harmonically related to any other frequency output of any other oscillator in the oscillator array.

12. The method of claim 11, wherein the frequency output that is generated by each oscillator is based on a number of stages of the oscillator, a delay associated with each stage of the oscillator, a fanout of the oscillator, and a setting of input signals input to the oscillator.

13. The method of claim 11, wherein each oscillator in the oscillator array includes one or more delay elements, and wherein the one or more delay elements cause the oscillator to generate a different frequency output based on a selling of input signals input to the one or more delay elements.

14. The method of claim 11, further comprising:
providing a cryptographic element coupled to the oscillator array, wherein one or more outputs of the oscillator array are coupled to the cryptographic element which uses the one or more outputs of the oscillator array to perform cryptographic operations.

15. The method of claim 14, wherein the cryptographic element is a random number generator element.

16. The method of claim 11, wherein each oscillator in a same oscillator column is unique from the other oscillators in the same oscillator column based on a combination of a number of stages in the oscillator and a fanout of the oscillator.

17. The method of claim 11, wherein oscillators of different columns within the oscillator array differ from one another at least by a setting of the input signals to these oscillators and a physical ordering of the oscillators in their respective oscillator columns.

18. The method of claim 11, wherein every oscillator column in the oscillator array has an opposite arrangement of oscillators from its neighboring oscillator column or columns.

19. The method of claim 13, wherein each of the delay elements includes a plurality of stages, and wherein each stage includes an inverter and a pass gate, and wherein the inverters of each stage have a different strength than inverters of other stages in the delay element.

20. A data processing device, comprising:

control logic; and an oscillator array coupled to the control logic, wherein the oscillator array includes a plurality of oscillator columns and each oscillator column has a plurality of oscillators, and wherein:

the control logic provides a plurality of input signals to the plurality of oscillators in the plurality of oscillator columns;

each oscillator in the oscillator array generates a frequency output, based on the input signals provided by the control logic, that is unique from every other oscillator in the oscillator array; and the frequency output by each oscillator in the oscillator array is not harmonically related to any other frequency output of any other oscillator in the oscillator array.

* * * * *